(12) United States Patent
Usui

(10) Patent No.: US 6,874,095 B2
(45) Date of Patent: Mar. 29, 2005

(54) MEMORY CONTROL SYSTEM

(75) Inventor: Minoru Usui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 622 days.

(21) Appl. No.: 10/036,539

(22) Filed: Jan. 7, 2002

(65) Prior Publication Data

US 2002/0184438 A1 Dec. 5, 2002

(30) Foreign Application Priority Data

May 31, 2001 (JP) ....................................... 2001-164723

(51) Int. Cl.⁷ ............................................... G06F 1/32
(52) U.S. Cl. ...................... 713/320; 713/324; 713/601
(58) Field of Search ................................ 713/300, 320, 713/322, 324, 600, 601

(56) References Cited

U.S. PATENT DOCUMENTS

| | | | | |
|---|---|---|---|---|
| 5,335,201 A | * | 8/1994 | Walther et al. | ............. 365/222 |
| 5,623,677 A | * | 4/1997 | Townsley et al. | ............ 713/310 |
| 6,088,762 A | * | 7/2000 | Creta | .......................... 711/106 |
| 6,321,313 B1 | * | 11/2001 | Ishii et al. | ................... 711/163 |
| 6,629,224 B1 | * | 9/2003 | Suzuki et al. | ................ 711/167 |

OTHER PUBLICATIONS

Patent Abstracts of Japan of JP 10–133960 dated May 22, 1998.

* cited by examiner

*Primary Examiner*—Dennis M. Butler
(74) *Attorney, Agent, or Firm*—Staas & Halsey LLP

(57) ABSTRACT

The processor, upon fetching a sleep command, stops its own operation and outputs an internal power-down signal. The power-down control circuit outputs, upon receiving the internal power-down signal from the processor, a control signal to put a volatile semiconductor memory connected to the system bus into a self refresh mode. Thus, the processor can simply fetch the sleep command to put the semiconductor memory into the self refresh mode. Since system programs need not include any processing program for putting the semiconductor memory into the self refresh mode, the software processing can be prevented from being complicated. As a result, it is possible to reduce the burden on the program developers.

8 Claims, 2 Drawing Sheets

MEMORY CONTROL SYSTEM

BACKGROUND OF THE INVENTION

1. Field of the Invention

The present invention relates to a memory control system having the interface of a volatile semiconductor memory.

2. Description of the Related Art

Memory control systems of this type include a control device of a large capacity hard disk drive and a data control device of a network. Such memory control systems, while transmitting no data, enter sleep to reduce their power consumption. During sleep, clock signals are suspended, and the system-controlling processors (such as a CPU) and control circuits connected to the processors stop operating.

In general, a processor has a sleep command, and fetches the sleep command to stop the reception of the clock signal to put itself into sleep. When the processor contains a PLL (Phase-Locked Loop), the fetch of the sleep command makes the PLL stop the operation of generating a system clock signal. The suspension of the system clock signal stops the operations of the control circuits in the processor and other control cores in the chip which receive the system clock signal, as well as other chips connected to the chip, thereby putting the system into sleep.

By the way, in situations where a memory control system is connected with volatile semiconductor memories such as a DRAM, there has been the problem that the contents retained in the memories can be destroyed if the processor simply fetches a sleep command to stop the generation of the system clock signal. In particular, if the memory control system is connected with clock synchronous SDRAMs (synchronous DRAMs), even a brief stop of the system clock signal causes the SDRAMs to malfunction, destroying the retained data.

In order to avoid the foregoing defect, when a memory control system connected with volatile memories such as an SDRAM is to be put into sleep, the volatile memories must be put into a data retaining mode such as a self refresh mode before the suspension of the system clock signal. Specifically, system programs to be executed by the processor need to include a processing program for putting the SDRAMs into the self refresh mode in advance of the sleep command, so that the volatile memories are previously put into the self refresh mode before the processor fetches the sleep command.

Here, even in the cases where the system programs are stored in the SDRAMs, at least the sleep command and the processing program for entering the self refresh mode must be stored in another memory. The reason for this is that if the processing program and the sleep command were stored in the SDRAMs, the execution of the processing program would put the SDRAMs into the self refresh mode, precluding the read of the sleep command. That is, the processor would not enter sleep.

Accordingly, in situations where the system programs are stored in the SDRAMs, there has been the problem that the system programs must be stored into both the SDRAMs and other memories, with complicated software processing. In particular, the program developers are heavily burdened since they need to develop the software upon a beforehand comprehension of these procedures and timing.

SUMMARY OF THE INVENTION

An object of the present invention is to provide a memory control system capable of putting the system into sleep without any memory other than a volatile memory such as an SDRAM.

Another object of the present invention is to provide a memory control system capable of putting the system into sleep without complicated software processing.

According to one of the aspects of the present invention, the memory control system includes a processor and a power-down control circuit. The processor is operative by fetching a program through a system bus. The processor, upon fetching a sleep command, stops its own operation and outputs an internal power-down signal. The power-down control circuit outputs, upon receiving the internal power-down signal from the processor, a control signal to put a volatile semiconductor memory connected to the system bus into a self refresh mode. Therefore, the processor can simply fetch the sleep command during the system operation, to put the volatile semiconductor memory connected to the memory control system into the self refresh mode. System programs need not include any processing program for putting the volatile semiconductor memory into the self refresh mode. The elimination of the need for storing the system programs in a plurality of memory areas make it possible to reduce the hardware in memory parts count and preclude the software processing from getting complicated. As a result, it is possible to reduce the development cost and lessen the burden on the program developers. Since no software processing is required for putting the volatile semiconductor memory into the self refresh mode, the volatile semiconductor memory can be put into the self refresh mode in a shorter time as compared to heretofore.

According to another aspect of the present invention, the program including the sleep command is stored in the volatile semiconductor memory. As described above, the volatile semiconductor memory is put into the self refresh mode under the control of the power-down control circuit instead of the control of the processor. Therefore, even if the processor enters sleep immediately after the fetch of the sleep command, the volatile semiconductor memory can be surely put into the self refresh mode. In this way, the processing of the processor and the processing of the power-down control circuit (the entering to the self refresh mode) can be executed separately so that the system is surely put into a sleep mode even if the program including the sleep command is stored in the volatile semiconductor memory. Besides, the collective storage of the programs into a single memory area can reduce the hardware in memory parts count and preclude the software processing from getting complicated.

According to another aspect of the present invention, the memory control system includes a clock control circuit. The clock control circuit is, for example, a phase-locked loop circuit for generating a system clock signal having the same phase as that of an external clock signal. The power-down control circuit outputs a clock disabling signal in response to the volatile semiconductor memory put into the self refresh mode. The clock control circuit receives the clock disabling signal to stop supplying the system clock signal. Therefore, in the memory control system connected with a clock synchronous volatile semiconductor memory, it is possible to surely put the volatile memory into the self refresh mode and the system into the sleep mode.

According to another aspect of the present invention, the power-down control circuit releases the volatile semiconductor memory from the self refresh mode in response to a sleep release request, and then outputs an operation enabling signal to the processor. At the time of the release from the sleep mode, the processor receives the operation enabling signal, and then starts fetching the program. Since the volatile semiconductor memory is released from the self refresh mode before the processor starts operation, the system can be operated with reliability. In particular, when the system program including the sleep command is stored in the volatile semiconductor memory, the system can be prevented from a malfunction in releasing the sleep mode.

According to another aspect of the present invention, the memory control system includes a clock control circuit. The clock control circuit is, for example, a phase-locked loop circuit for generating a system clock signal having the same phase as that of an external clock signal. The power-down control circuit outputs the clock enabling signal, and then releases the volatile semiconductor memory from the self refresh mode. The clock control circuit receives the clock enabling signal output from the power-down control circuit, to start supplying a system clock signal. Therefore, in the memory control system connected with a clock synchronous volatile memory, it is possible to surely release the volatile memory from the self refresh mode and put the system into a normal operation mode from the sleep mode.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, an embodiment of the present invention will be described with reference to the drawings.

Figure 1:
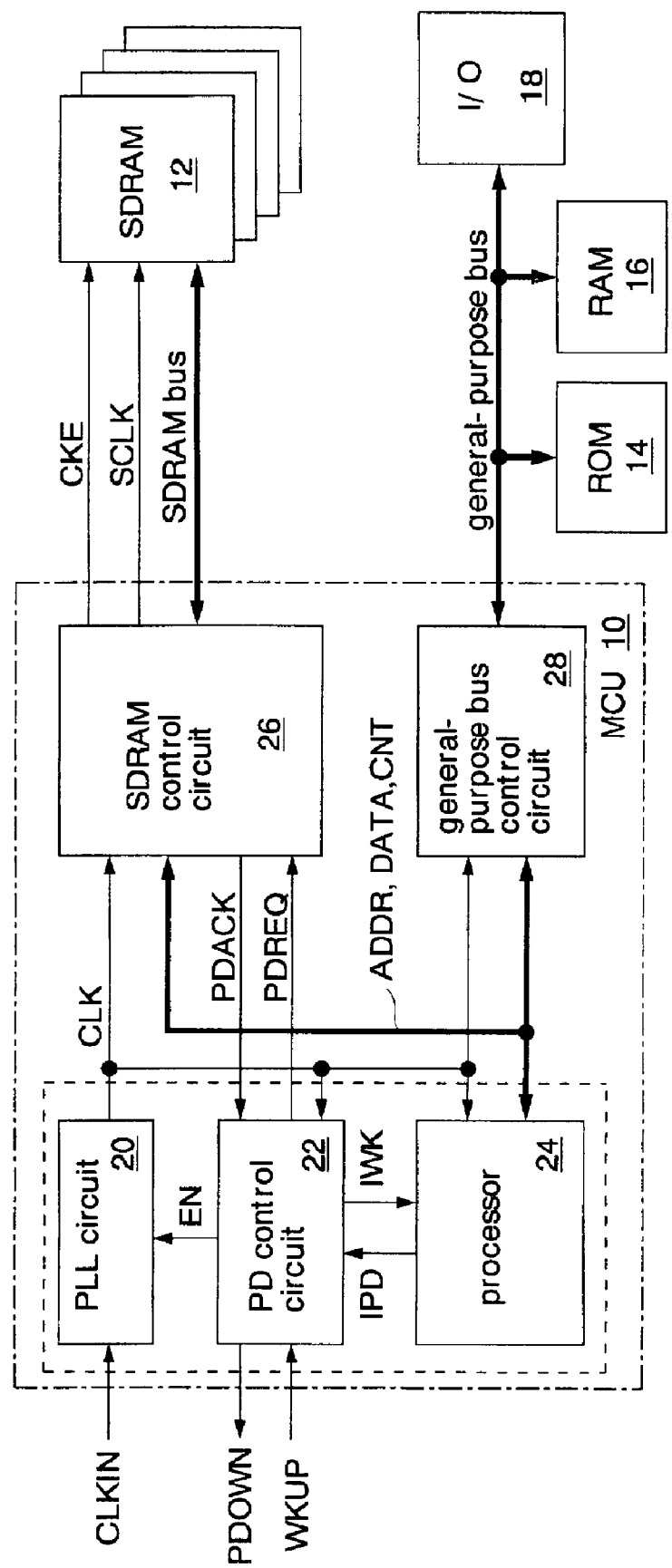
FIG. 1 is a block diagram showing an embodiment of the memory control system in the present invention.

FIG. 1 shows an embodiment of the memory control system according to the present invention. In the diagram, each thick line represents a signal line consisting of a plurality of signal lines.

The memory control system is composed of a single-chip microcomputer 10 (hereinafter, referred to as MCU (Micro Controller Unit)) which is mounted on a printed-wring board. The MCU 10 is connected with a plurality of SDRAMs 12 (clock synchronous volatile semiconductor memories), a ROM 14, a RAM 16, an I/O 18, and the like. The MCU 10 and the SDRAMs 12 are connected via an SDRAM bus (system bus). The MCU 10 and the ROM 14, RAM 16, and I/O 18 are connected via a general-purpose bus (system bus).

The MCU 10 has a PLL (Phase-Locked Loop) circuit 20, a PD control circuit 20 (main control circuit), a processor 24, an SDRAM control circuit 26, and a general-purpose bus control circuit 28. The PLL circuit 20, the PD circuit 20, and the processor 24, shown surrounded by the broken lines, are formed as a processor core. In this embodiment, the PD control circuit 20 and the SDRAM control circuit 26 operate as a power-down control circuit.

The PLL circuit 20 operates during the high level period of an enable signal EN, and generates a system clock signal CLK having the same phase as that of a clock signal CLKIN supplied from exterior. The system clock signal CLK is supplied to the PD control circuit 22, the processor 24, the SDRAM control circuit 26, and the general-purpose bus control circuit 28.

The PD control circuit 22 controls the PLL circuit 20, the processor 24, and the SDRAM control circuit 26, to put the system into a sleep mode (power-down mode) or return the system from the sleep mode to an operation mode. That is, in the present invention, the sleep control of the memory control system is effected directly by the PD control circuit 22, not by the processor 24 (software). The PD control circuit 22 receives a wake-up signal WKUP from exterior, an internal power-down signal IPD from the processor 24, and a power-down acknowledge signal PDACK from the SDRAM control circuit 26. The PD control circuit 22 outputs the enable signal EN, a power-down signal PDOWN, an internal wake-up signal IWK, and a power-down request signal PDREQ. The input/output timing of these signals will be detailed in FIG. 2.

The processor 24 controls the entire system during normal operations. Specifically, the processor 24, as will be described later, operates by fetching system programs stored in the SDRAMs 12 through the SDRAM bus, and controls the I/O 18 and the like.

The SDRAM control circuit 26 converts an address signal ADDR, a data signal DATA, and a control signal CNT supplied from the processor 24, into the interface of the SDRAM bus. For example, the SDRAM control circuit 26 outputs addresses, commands, and the like to the SDRAM bus in accordance with instructions from the processor 24, and outputs data received from the SDRAMs to the processor 24. The SDRAM control circuit 26 outputs the system clock signal CLK as a clock signal SCLK intended for the SDRAMs 12. Besides, the SDRAM control circuit 26, upon receiving the activation of the power-down request signal PDREQ from the PD control circuit 22, inactivates a clock enable signal CKE to put the SDRAMs 12 into a self refresh mode. Upon receiving the inactivation of the power-down request signal PDREQ from the PD control circuit 22, the SDRAM control circuit 26 activates the clock enable signal CKE to release the SDRAMs 12 from the self refresh mode, and then outputs the power-down acknowledge signal PDACK to the PD control circuit 22. In this way, the clock enable signal CKE functions as a control signal for putting the SDRAMs 12 into the self refresh mode as well as a control signal for releasing the SDRAMs 12 from the self refresh mode.

The general-purpose bus control circuit 28 converts the address signal ADDR, the data signal DATA, and the control signal CNT supplied from the processor 24, into the interface of the general-purpose bus. The general-purpose bus control circuit 28 receives data signals and the like output to the general-purpose bus, and outputs the received signals to the processor 24.

Figure 2:
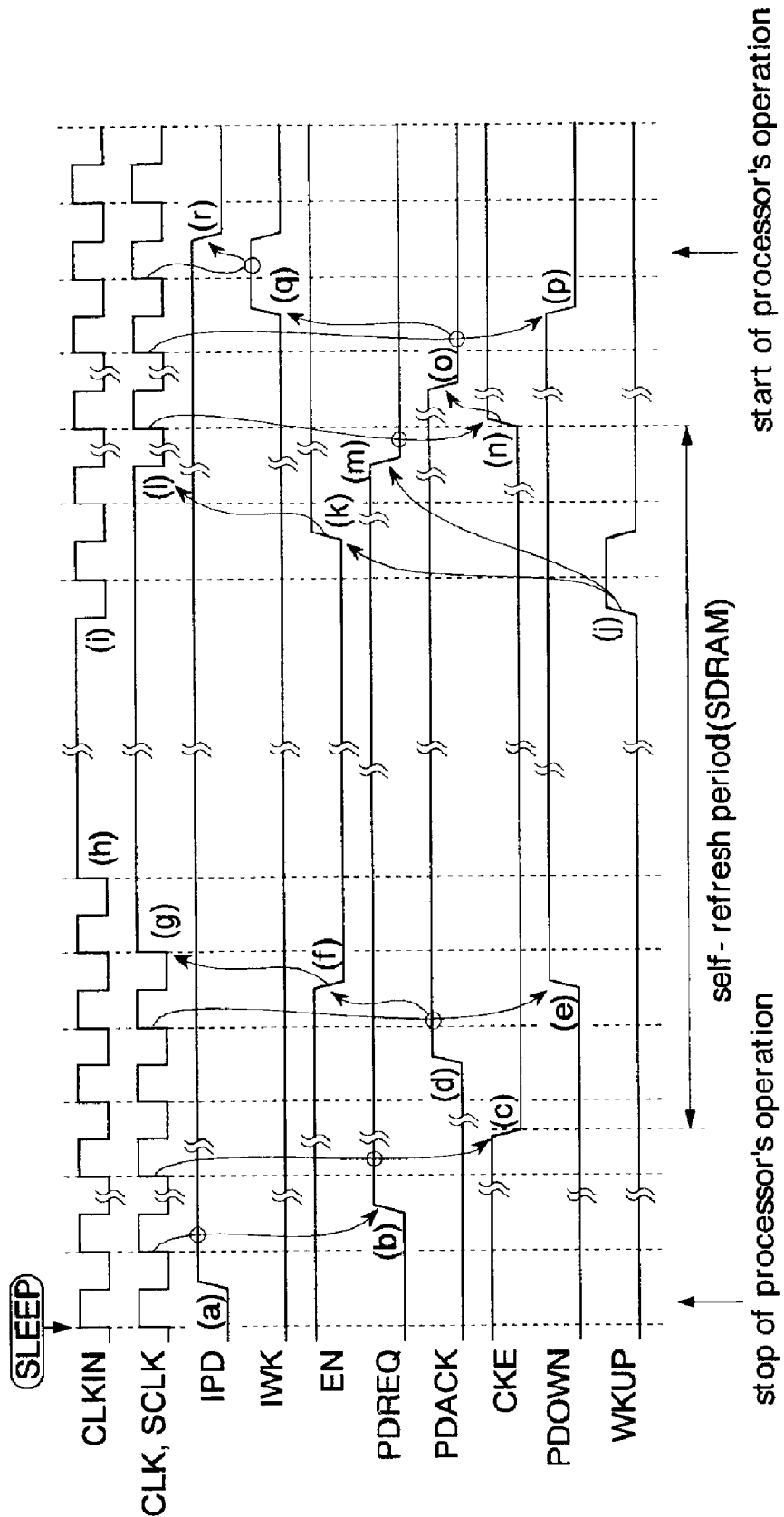
FIG. 2 is a timing chart showing the operations of the memory control system of FIG. 1.

FIG. 2 shows the operations of the above-described memory control system at the time of being put into the sleep mode and at the time of release from the sleep mode. In this example, the system programs to be executed by the processor 24 shown in FIG. 1 are stored only in the SDRAMs 12.

The processor 24, upon fetching a sleep command SLEEP from the SDRAMs 12 during the execution of the system program, stops its internal operation (sleep) and activates the internal power-down signal IPD (FIG. 2(a)). The PD control circuit 22 accepts the high level of the internal power-down signal IPD in synchronization with a rise of the system clock signal CLK, and activates the power-down request signal PDREQ (FIG. 2(b)).

The SDRAM control circuit 26 accepts the high level of the power-down request signal PDREQ in synchronization with a rise of the system clock signal CLK, and inactivates the clock enable signal CKE (FIG. 2(c)). Here, the SDRAM control circuit 26 may inactivate the clock enable signal CKE immediately after the acceptance of the high level of the power-down request signal PDREQ, or perform auto refresh on all the memory cells in the SDRAMs 12 before the inactivation of the clock enable signal CKE.

The SDRAMs 12 receive the inactivation of the clock enable signal CKE, and enter the self refresh mode. The SDRAMs 12, while in the self refresh mode, generate a refresh command at predetermined periods with their internal timers, thereby refreshing the memory cells automatically.

In this way, the processor 24 and the PD control circuit 22 make separate operations. Therefore, even if the system program including the sleep command SLEEP is stored in the SDRAMs 12, and the processor 24 enters sleep immediately after the acceptance of the sleep command SLEEP, the SDRAMs 12 are surely put into the self refresh mode.

After the SDRAMs 12 put into the self refresh mode, the SDRAM control circuit 26 activates the power-down acknowledge signal PDACK (FIG. 2(d)). The PD control circuit 22 accepts the high level of the power-down acknowledge signal PDACK in synchronization with a rise of the system clock signal CLK, outputs the power-down signal PDOWN to exterior (FIG. 2(e)), and inactivates the enable signal EN (FIG. 2(f)).

The PLL circuit 20 receives the inactivation (low level) of the enable signal EN, and stops generating the system clock signal CLK (FIG. 2(g)). That is, the enable signal EN of low level functions as a clock disabling signal for suspending the supply of the system clock signal CLK. Due to the suspension of the system clock signal CLK, the clock signal SCLK intended for the SDRAMs also stops oscillating. An external control circuit that receives the activation of the power-down signal PDOWN stops supplying the clock signal CLKIN (FIG. 2(h)). Then, the entire system enters the sleep mode.

In this way, the processor 24 activates the internal power-down signal IPD according to the fetch of the sleep command SLEEP. The PD control circuit 22 receives the internal power-down signal IPD to put the SDRAMs 12 into the self refresh mode. Since the processor 24 can simply fetch the sleep command SLEEP to put the SDRAMs 12 into the self refresh mode and the system is put into the sleep mode, conventional software-based processing such as a processing program for putting the SDRAMs 12 into the self refresh mode is unnecessary. This eliminates the need to divide the system programs between the SDRAMs 12 and other memories (for example, the RAM 16 in FIG. 1), thereby reducing the burden on program developers. Since no software processing is involved, the SDRAM are put into the self refresh mode in a shorter time than heretofore.

Now, to release the sleep mode, the external control unit starts supplying the clock signal CLKIN (FIG. 2(i)) and then activates the wake-up signal WKUP (a signal for a sleep release request) (FIG. 2(j)). The PD control circuit 22 receives the rising edge of the wakeup signal WKUP, and activates the enable signal EN (FIG. 2(k)).

The PLL circuit 20 receives the activation (high level) of the enable signal EN, and starts generating the system clock signal CLK (FIG. 2(l)). That is, the enable signal EN of high level functions as a clock enabling signal for starting the supply of the system clock signal CLK.

After a lapse of time in which the system clock signal CLK is stabilized in oscillation, the PD control circuit 22 inactivates the power-down request signal PDREQ (FIG. 2(m)). The SDRAM control circuit 26 receives the low level of the power-down request signal PDREQ in synchronization with a rise of the system clock signal CLK, and activates the clock enable signal CKE (FIG. 2(n)). The SDRAMs 12 is put into a normal standby mode from the self refresh mode by receiving the activation of the clock enable signal CKE.

After the release of the SDRAMs 12 from the self refresh mode, the SDRAM control circuit 26 inactivates the power-down acknowledge signal PDACK (FIG. 2(o)). The PD control circuit 22 receives the low level of the power-down acknowledge signal PDACK in synchronization with a rise of the system clock signal CLK, inactivates the power-down signal PDOWN (FIG. 2(p)), and activates the internal wake-up signal IWK (FIG. 2(q)). Here, the internal wake-up signal IWK is an operation enabling signal to the processor 24. The external control circuit receives the inactivation of the power-down signal PDOWN to recognize that the memory control system is released from sleep. The processor 24 receives the high level of the internal wake-up signal IWK in synchronization with a rise of the system clock signal CLK, releases the sleep mode, and inactivates the internal power-down signal IPD (FIG. 2(r)). After the reception of the internal wake-up signal IWK, the processor 24 starts its internal operation to refetch the system programs from the SDRAMs. Then, the system starts operating again.

As has been described, in the present embodiment, the PD control circuit 22 and the SDRAM control circuit 26, on receiving the internal power-down signal IPD from the processor 24, inactivate the clock enable signal CKE and put the SDRAMs 12 into the self refresh mode. Therefore, the processor 24 can simply fetch the sleep command SLEEP during the system operation, to put the SDRAMs 12 connected to the memory control system into the self refresh mode without the intervention of software.

Since no software processing is involved in putting the SDRAMs 12 into the self refresh mode, the SDRAMs 12 can be put into the self refresh mode in a shorter time than heretofore.

Since the processing of the processor 24 and the processing of the PD control circuit 22 (the entering to the self refresh mode) are executed separately, the system programs need not include any processing program for putting the SDRAMs 12 into the self refresh mode. Moreover, the absence of the need for storing the system programs into a plurality of memory areas can preclude the software processing from getting complicated. As a result, it is possible to reduce the burden on the program developers.

The PLL circuit 20 receives the inactivation of the enable signal EN and stops supplying the system clock signal CLK after the SDRAMs 12 are put into the self refresh mode. Therefore, in the memory control system connected with the clock synchronous SDRAMs 12, it is possible to surely put the SDRAMs 12 into the self refresh mode and put the system into the sleep mode.

The processor 24 starts fetching the system programs after the reception of the internal wake-up signal IWK from the PD control circuit 22. Because the SDRAMs 12 are released from the self refresh mode before the processor 24 starts its operation, the system can be operated with reliability. In particular, when the system program including the sleep command is stored in the SDRAMs 12, the system can be prevented from a malfunction in releasing the sleep mode.

The PLL circuit 20 receives the activation of the enable signal EN and starts supplying the system clock signal CLK before the SDRAMs 12 are released from the self refresh mode. Therefore, in the memory control system connected with the clock synchronous SDRAMs 12, it is possible to surely release the SDRAMs 12 from the self refresh mode and put the system into a normal operation mode from the sleep mode.

Incidentally, the foregoing embodiment has dealt with the case where the processor 24 turns the internal power-down signal IPD to high level in entering the sleep mode, maintains it at high level while in the sleep mode, and turns it to low level in exiting from the sleep mode. However, the present invention is not limited to such an embodiment. For example, the processor 24 may output pulsed internal power-down signals IPD. Here, the PD control circuit 22 should recognize even-numbered internal power-down signals IPD as entering the sleep mode, and odd-numbered internal power-down signals IPD as releases from the sleep mode. The power-down request signal PDREQ and the power-down acknowledge signal PDACK may also be output in pulses.

The invention is not limited to the above embodiments and various modifications may be made without departing from the spirit and the scope of the invention. Any improvement may be made in part or all of the components.

What is claimed is:

1. A memory control system comprising:
   a processor for operating upon fetching a program through a system bus and stopping its own operation and outputting an internal power-down signal upon fetching a sleep command; and
   a power-down control circuit for outputting, upon receiving said internal power-down signal, a control signal to put a volatile semiconductor memory connected to said system bus into a self refresh mode.

2. The memory control system according to claim 1, wherein
   said program including said sleep command is stored in said volatile semiconductor memory.

3. The memory control system according to claim 1, comprising
   a clock control circuit for receiving a clock disabling signal output from said power-down control circuit and stopping supplying a system clock signal, and wherein
   said power-down control circuit outputs said clock disabling signal after said volatile semiconductor memory is put into said self refresh mode.

4. The memory control system according to claim 3, wherein
   said clock control circuit is a phase-locked loop circuit for generating said system clock signal having a phase the same as a phase of an external clock signal.

5. The memory control system according to claim 1, wherein:
   said power-down control circuit outputs an operation enabling signal to said processor after releasing said volatile semiconductor memory from said self refresh mode in response to a sleep release request; and
   said processor starts fetching said program after receiving said operation enabling signal.

6. The memory control system according to claim 5, comprising
   a clock control circuit for receiving a clock enabling signal output from said power-down control circuit and starting supplying a system clock signal, and wherein
   said power-down control circuit releases said volatile semiconductor memory from said self refresh mode after outputting said clock enabling signal.

7. The memory control system according to claim 6, wherein
   said clock control circuit is a phase-locked loop circuit for generating said system clock signal having a phase the same as a phase of an external clock signal.

8. The memory control system according to claim 1, wherein:
   said power-down control circuit includes a memory control circuit for directly controlling said volatile semiconductor memory, and a main control circuit for controlling said memory control circuit;
   said main control circuit outputs a power-down request signal to said memory control circuit in response to said internal power-down signal; and
   said memory control circuit outputs said control signal in response to said power-down request signal, and outputs a power-down acknowledge signal to said main control circuit in response to said volatile semiconductor memory being put into said self refresh mode.

* * * * *